(12) United States Patent
Partridge

(10) Patent No.: US 7,675,155 B2
(45) Date of Patent: Mar. 9, 2010

(54) CARRIER STRUCTURE STACKING SYSTEM AND METHOD

(75) Inventor: Julian Partridge, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 0 days.

(21) Appl. No.: 12/262,927

(22) Filed: Oct. 31, 2008

(65) Prior Publication Data

US 2009/0072376 A1 Mar. 19, 2009

Related U.S. Application Data

(63) Continuation of application No. 11/452,531, filed on Jun. 14, 2006, now Pat. No. 7,446,403.

(51) Int. Cl.
*H01L 23/02* (2006.01)

(52) U.S. Cl. ............... 257/686; 257/674; 257/685; 257/690; 257/693; 257/E25.006; 257/E25.013; 257/E25.027; 257/E23.085; 257/E23.067; 257/E23.145

(58) Field of Classification Search ............... 257/686
See application file for complete search history.

(56) References Cited

U.S. PATENT DOCUMENTS

| 5,266,834 A | 11/1993 | Nishi et al. |
| 5,343,075 A | 8/1994 | Nishino |
| 5,514,907 A | 5/1996 | Moshayedi |
| 5,594,626 A * | 1/1997 | Rostoker et al. ............ 361/784 |
| 6,462,408 B1 | 10/2002 | Wehrly, Jr. |
| 6,608,763 B1 * | 8/2003 | Burns et al. ................ 361/790 |
| 7,259,452 B2 * | 8/2007 | Wehrly et al. ............... 257/686 |
| 7,375,418 B2 | 5/2008 | Partridge |

FOREIGN PATENT DOCUMENTS

JP 6077644 10/1994

* cited by examiner

*Primary Examiner*—Jasmine J Clark
(74) *Attorney, Agent, or Firm*—Civins Denko Coburn & Lauff LLP

(57) ABSTRACT

The present invention provides a system and method for selectively stacking and interconnecting leaded packaged integrated circuit devices with connections between the feet of leads of an upper IC and the upper shoulder of leads of a lower IC while conductive transits that implement stacking-related intra-stack connections between the constituent ICs are implemented in multi-layer interposers or carrier structures oriented along the leaded sides of the stack, with selected ones of the conductive transits electrically interconnected with other selected ones of the conductive transits.

5 Claims, 8 Drawing Sheets

CARRIER STRUCTURE STACKING SYSTEM AND METHOD

RELATED APPLICATIONS

This application is a continuation of U.S. patent application Ser. No. 11/452,531, filed Jun. 14, 2006, now U.S. Pat. No. 7,446,403 and titled Carrier Structure Stacking System and Method.

TECHNICAL FIELD

The present invention relates to aggregating integrated circuits and, in particular, to stacking integrated circuits.

BACKGROUND

A variety of techniques are used to stack packaged integrated circuits into a module. Some require that the circuits be encapsulated in special packages, while others use circuits in conventional packages. Both leaded and BGA type packaged integrated circuits (ICs) have been stacked. Although BGA packaging has become widely adopted, leaded packages are still employed in large volumes in low cost applications such as, for example, flash memory, which typically is packaged in thin small outline packages otherwise known as TSOPs.

When leaded packages such as TSOPs are stacked, a variety of techniques have been employed. In some cases, the leads alone of packaged circuits have been used to create the stack and interconnect its constituent elements. In other techniques, structural elements such as printed circuit boards (PCBs) are used to create the stack and interconnect the constituent elements.

Circuit boards and rail-like structures in vertical orientations have been used for years to provide interconnection between stack elements. For example, in U.S. Pat. No. 5,514,907 to Moshayedi, a technique is described for creating a multi-chip module from surface-mount packaged memory chips. The devices are interconnected on their lead-emergent edges through printed circuit boards oriented vertically to a carrier or motherboard that is contacted by connective sites along the bottom of the edge-placed PCBs. The PCBs have internal connective rail-like structures or vias that interconnect selected leads of the upper and lower packaged memory chips. Japanese Patent Laid-open Publication No. Hei 6-77644 discloses vertical PCBs used as side boards to interconnect packaged circuit members of the stack. In U.S. Pat. No. 5,266,834 to Nishi et al., one depicted embodiment illustrates a stack created by selective orientation of the leads of particularly configured stack elements, while in U.S. Pat. No. 5,343,075 to Nishino, a stack of semiconductor devices is created with contact plates having connective lines on inner surfaces to connect the elements of the stack. Another technique for stacking leaded packaged ICs with carrier structures or interposers oriented along lead bearing sides of packaged devices such as TSOPs is disclosed by the present assignee, Staktek Group L.P., in U.S. Pat. No. 6,608,763 issued Aug. 19, 2003, to Burns et al., which is incorporated herein by reference for all purposes.

Many of the previously cited and known techniques for using PCBs and similar interposer structures for stacking leaded packaged devices into modules have evolved to meet the increased connective complexity presented by, for example, stacking memory components that have two or more chip enables per packaged device. Connectivity complexities, however, can arise in any applications where there is a need to connect non-adjacent leads of the module ICs. In some cases, this evolution has included use of interposer designs that employ four metal-layer designs to implement the more complex connection strategies required by more complex devices. Size limitations and other factors applicable to packaged IC stacking, however, have led to complexities in via and connection strategies. For example, trace routing and other connective requirements for interposers or carrier structures used in many applications may require the use of buried vias and/or blind vias. In various applications, the micro vias are used for blind vias. The use of multi-layer PCBs with buried vias and blind vias to address complex routing and other connective demands, however, increases costs and may present quality issues due to tight tolerances required.

What is needed, therefore, is a system and method for stacking leaded packaged devices with multi-layer interposer or carrier structure technologies that are easily understood and implemented with simpler and more reliable techniques and materials, but still implement more complex connection strategies.

SUMMARY

The present invention provides a system and method for selectively stacking and interconnecting leaded packaged integrated circuit devices. In preferred embodiments, interposers or carrier structures are connected between the feet of leads of an upper IC and the upper shoulders of leads of a lower IC, with electrical interconnections disposed at various layers of the interposers or carrier structures implementing stacking-related intra-stack connections between the constituent ICs.

Preferred embodiments having a multi-layer interposer or carrier structure provide electrical connection between the layers with conductive transits extending through the interposers or carrier structure, which conductive transits for embodiments using a multi-layer PCB interposer or carrier structure may take the form of plated-through holes. Selected ones of the conductive transits may have connective elements, for example connective pads, at each end of the passage, with one of the connective elements connected to a shoulder of a lead of a lower IC and the other of the connective elements connected to a foot of a lead of an upper IC package. Selected ones of the conductive transits may have a connective pad at only one end of the passage, which is connected to a lead of a of one of the ICs, and have a capture pad at its other end, which capture pad may be covered with a solder mask or other insulative covering to prevent contact with a nearby IC lead. Embodiments with particularly complex trace routing or other connective requirements may have selected conductive transits that have no connective pad at either end, and have capture pads terminating the passage at both ends, one or both of which capture pads may be covered with a solder mask or other electrical insulator to prevent contact with nearby IC leads.

Preferred embodiments may have electrical interconnections between selected conductive transits disposed at one or more layers of an interposer or carrier structure, which for embodiments having a multi-layer PCB interposer or carrier structure may be implemented by with traces disposed along internal layers of the PCB. Capture pads for selected conductive transits may be disposed at various layers of the interposer or carrier structure for the electrical interconnections.

"side boards"), such as various embodiments that may be devised in accordance with the present invention, to implement intra-stack connections.

Figure 2:
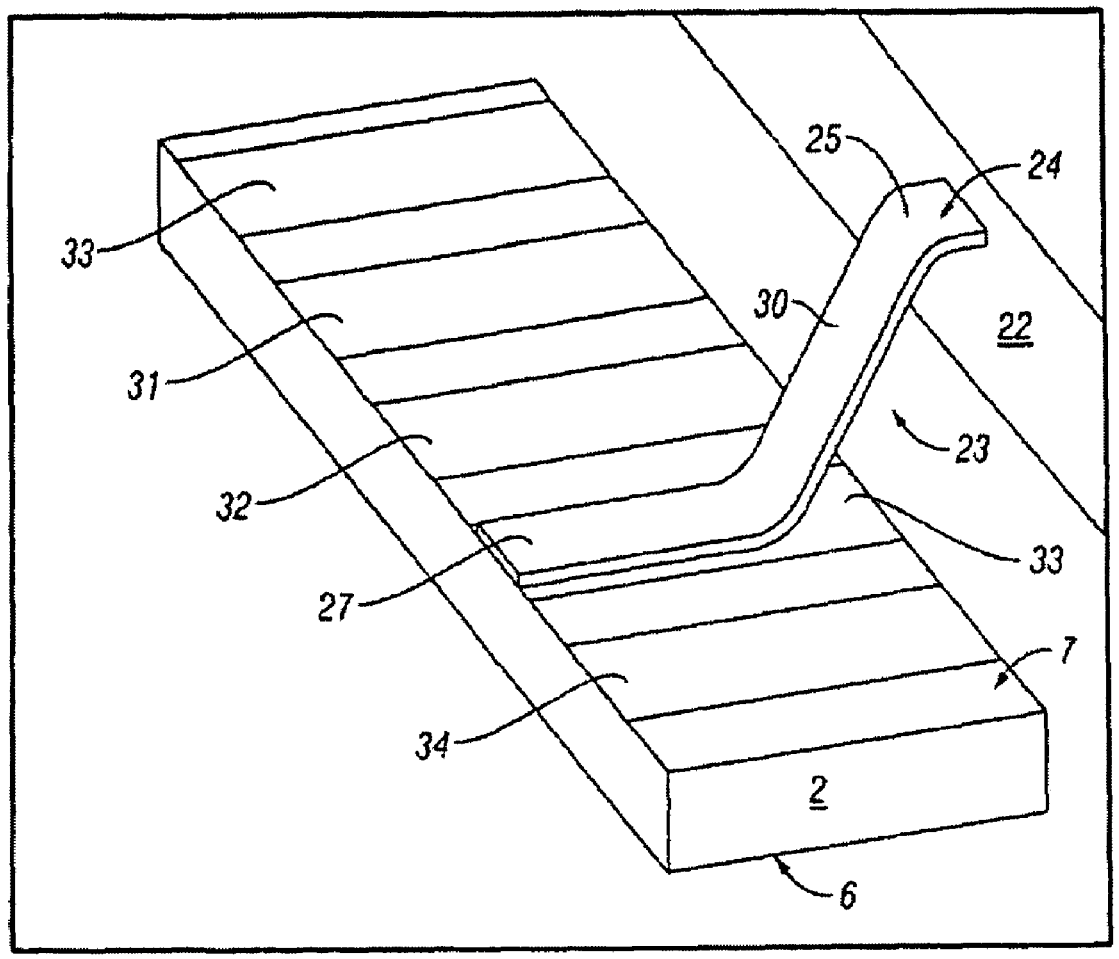

FIG. 2 depicts the connection of the foot of an exemplar lead of an upper IC to an exemplar connective pad of an interposer.

Figure 3:
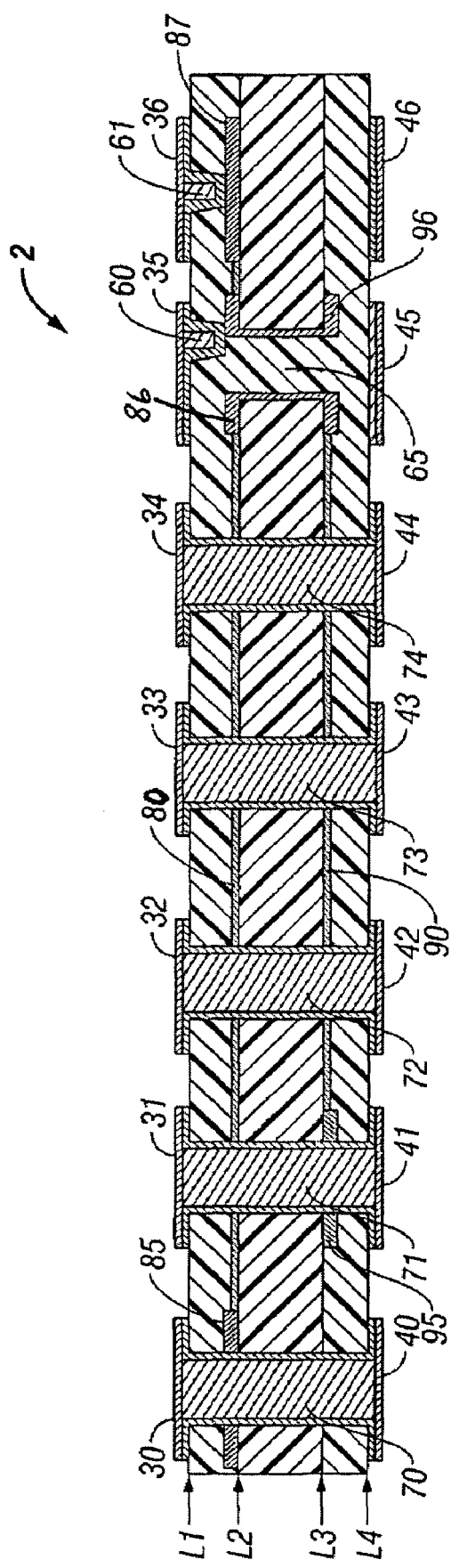

FIG. 3 depicts an idealized cross-section of a portion of an interposer or carrier structure exhibiting its internal structure.

Figure 4:
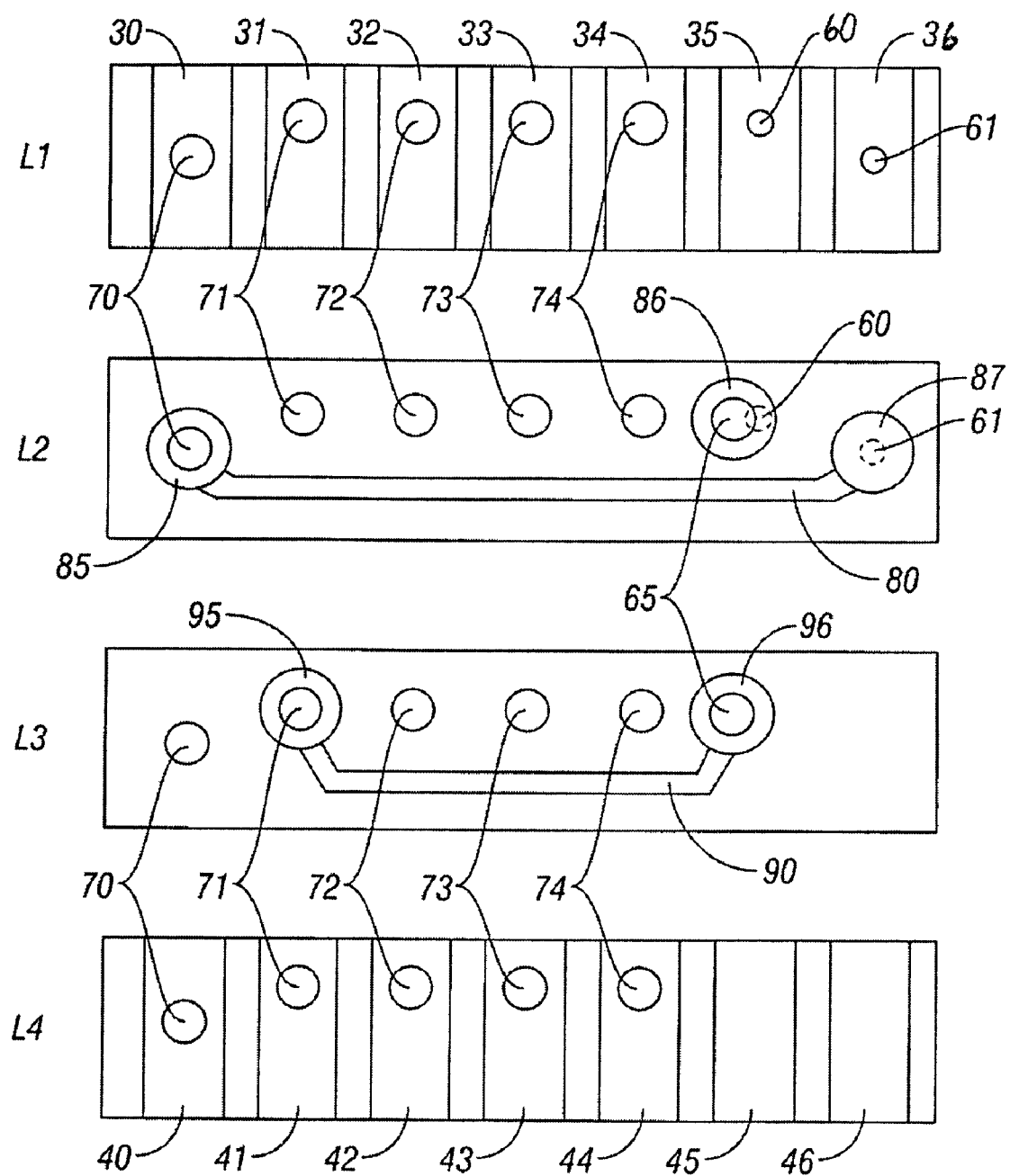

FIG. 4 depicts a plan view from above of selected layers of the interposer illustrated in FIG. 3.

Figure 5:
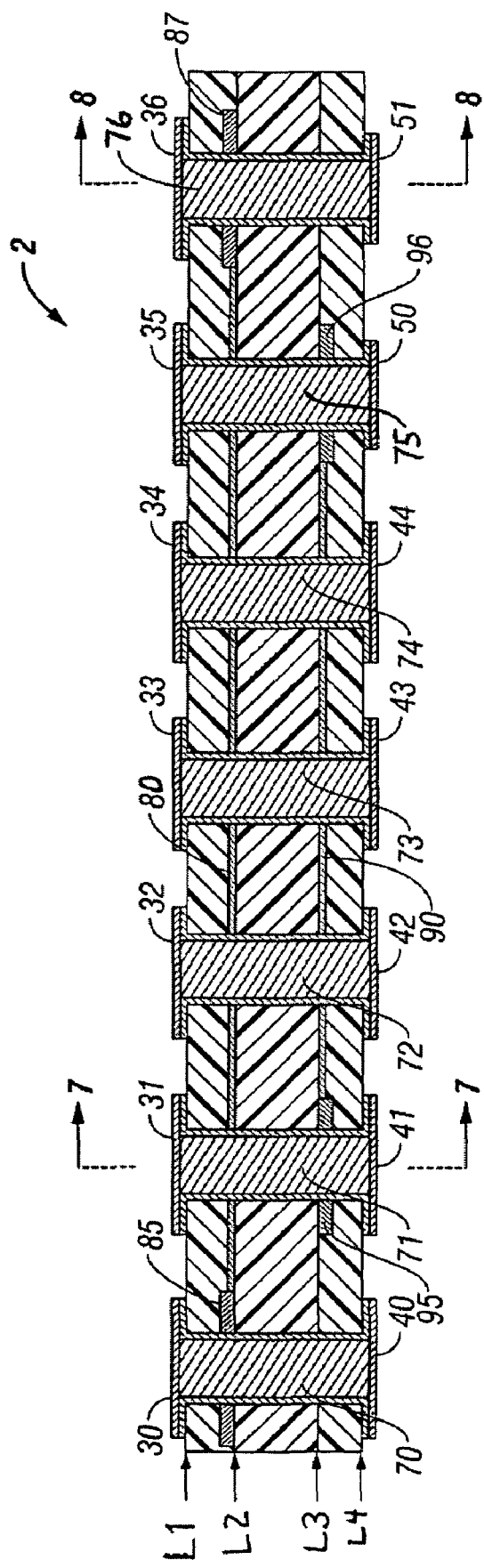

FIG. 5 depicts an idealized cross-section of a portion of an interposer of a preferred embodiment of the present invention exhibiting its internal structure.

Figure 6:
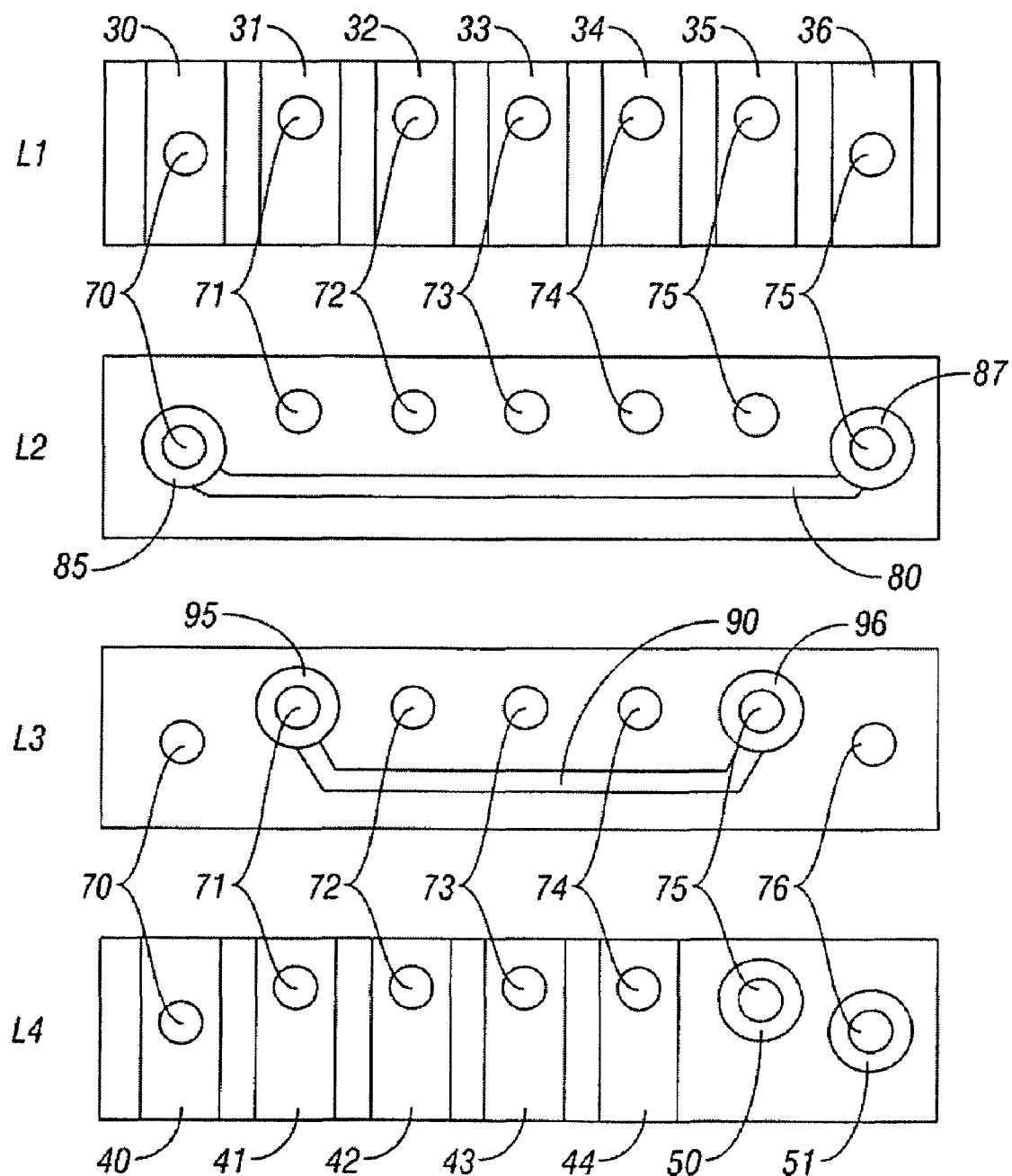

FIG. 6 depicts a plan view from above of selected layers of the interposer illustrated in FIG. 5.

Figure 7:
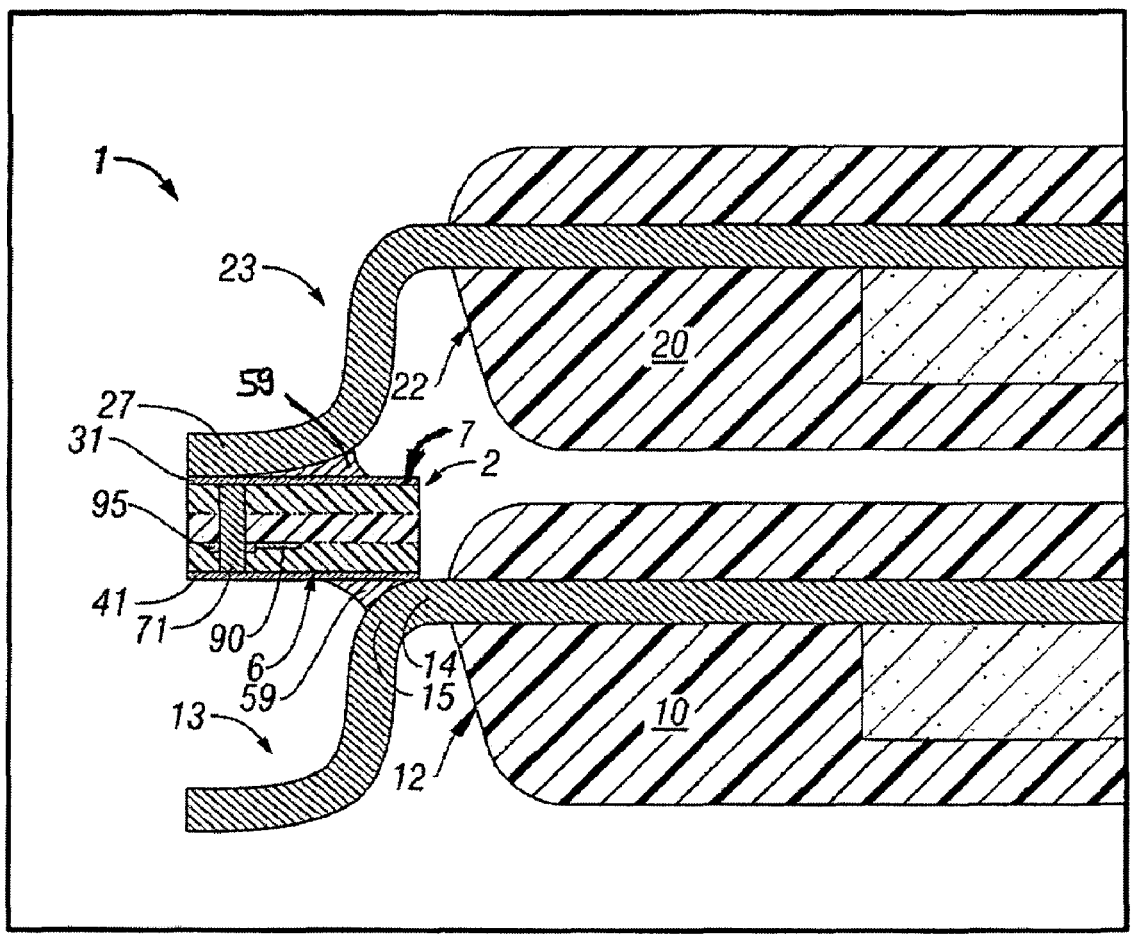

FIG. 7 depicts a partial cross-section of an exemplar interposer or carrier structure in accordance with a preferred embodiment of the present invention.

Figure 8:
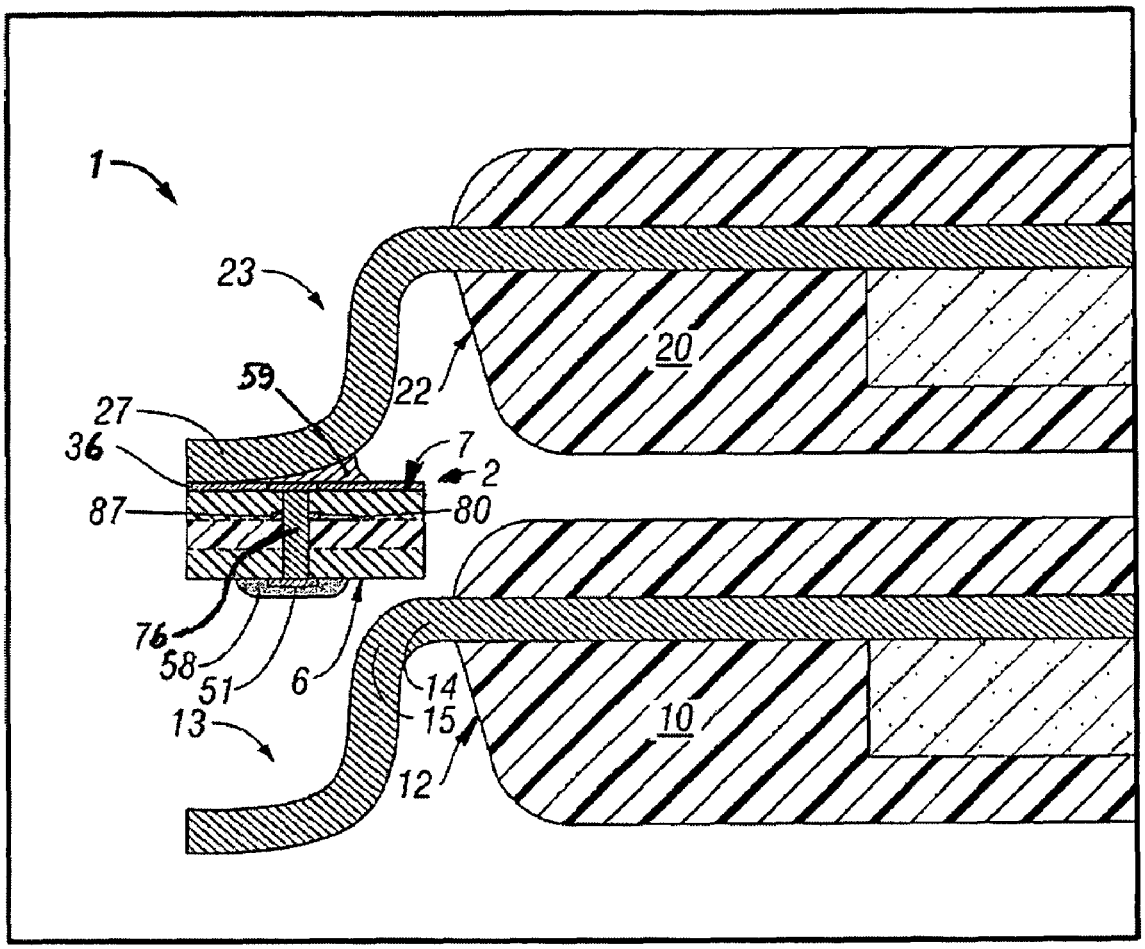

FIG. 8 depicts another partial cross-section of an exemplar interposer or carrier structure in accordance with a preferred embodiment of the present invention.

DETAILED DESCRIPTION

Figure 1:
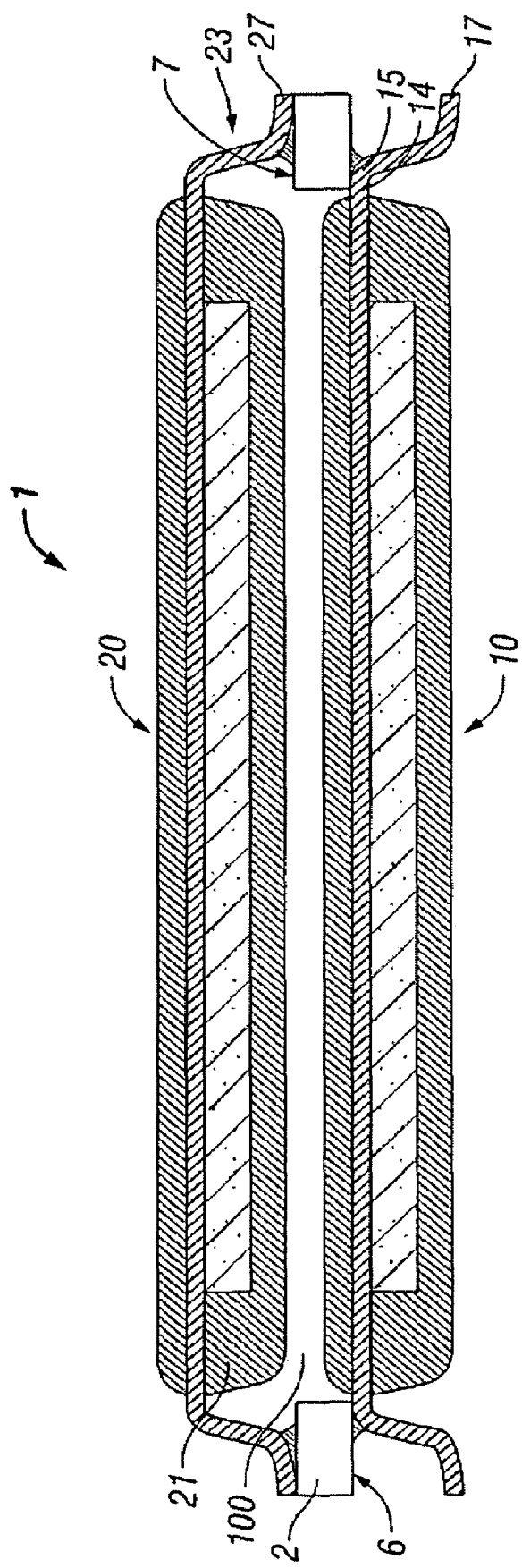
FIG. 1 depicts a cross-section of a portion of a circuit module that employs interposers (e.g., "carrier structures,"

FIG. 1 depicts a cross-section of a portion of a circuit module 1 that employs interposers (e.g., "carrier structures," "side boards") that implement intra-stack connections. A preferred embodiment of a module 1 employing a multi-layer interposer design using conductive transits is created with upper IC 20 and lower IC 10. Each of ICs 10 and 20 are, in the described preferred embodiment, plastic encapsulated memory circuits disposed in thin small outline packages known as TSOPs. Other package types may be used with the present invention as well as packaged circuits other than memories, but, as described here as preferred examples, the invention is advantageously implemented with memories in TSOP packaging. Flash memory circuits implemented in TSOP packaging are one type of preferred constituent ICs 10 and 20. In the illustrated embodiment, there is an air gap 100 between IC 10 and IC 20, although a heat transference material or adhesive may reside between the ICs. As shown in FIG. 1, an interposer 2 resides along the edge of the module and interconnects the feet 27 of leads 23 of the upper IC 20 to the shoulder 15 of leads 13 of the lower IC 10.

FIG. 2 depicts the connection of a foot 27 of an exemplar lead 23 of the upper IC 20 to an exemplar connective pad 33 of an interposer 2 partially illustrated in the figure. Plural leads emerge from a peripheral wall or edge 22 of upper IC 20, one of which is illustrated as lead 23, and provide a connective pathway for the electronics of the circuitry chip embedded within plastic body 21 of exemplar IC 20. Lead 23 of upper IC 20 is shown as having foot 27 and shoulder 25 and transit section 30. In practice, lead 23 and, in particular, transit section 30, are surfaces from which heat from the internal chip(s) of the TSOP is dissipated by local air convection. Shoulder 25 can extend from and include the planar part of lead 23 emergent from peripheral wall 22 (i.e., the "head" of the shoulder identified by reference 24) to the end of the curvature into transit section 30. Transit section 30 is often a substantially straight path but may exhibit curvature. As leads 23 emerge from the package periphery 22, a supportive shelf or plane is created or defined (respectively) by the heads of the plurality of leads on a side. These features of leads 23 are present in conventional TSOP packaged memory circuits such as flash memory available from most major suppliers of packaged memories. Foot 27 is provided to allow the mounting of the IC on the surface of a printed circuit or other carrier and signal transit board. Surface mount soldering techniques or other known methods know in the art may be employed to make the connection. Those of skill will recognize, however, that various combinations of lead features may be present in different packaged ICs that may be deployed in embodiments of the present invention.

In module 1, the lower surface 6 of interposer 2 is placed along the plane of heads 14 of selected leads of lower IC 10 as shown in FIGS. 1, 7 and 8. Carrier structure or interposer 2 is, in a preferred embodiment, printed circuit board material or other carrier material. Other structures that provide connective elements in an insulative bed or carrier may be employed as interposer or carrier structure 2. So called flex circuit, known to those of skill in the art is an example of an alternative material for interposer or carrier structure 2. Interposer or carrier structure 2 retains upper IC 20 in orientation with lower IC 10. Interposer 2 provides a horizontal structure to support electrical connection between appropriate leads of upper and lower ICs 20 and 10. Such a method and structure exploits the existing lead assemblage of the constituent ICs. Although the leads are provided by the TSOP manufacturer to enable surface mounting (SMT) of the TSOP, the horizontal interposer or carrier structure 2 provides advantages to the lead assemblage, namely, a low capacitance carrier for a conductive pathway that allows inter-element spacing, efficient cooling, and simple stack construction and interconnectivity with structural integrity and appropriate height.

In a preferred embodiment, two interposers 2 are typically employed in a module 1 comprising two TSOP memory devices. One interposer 2 is disposed along one leaded periphery of module 1, while another interposer 2 is disposed in conjunction with an opposite leaded periphery of the module. The same principles may be applied to stacks where the constituent ICs have more or fewer than two leaded sides.

In structures such as those depicted in FIG. 1 and FIG. 2, the interposers typically do not extend beyond the module outline profile established by the distal ends of the feet 17, 27 of the constituent ICs 10, 20. Simple electrical interconnections between leads 13, 23 of the ICs 10, 20 may be provided with trace routing and/or other connective structures on the lower surface 6 or upper surface 7 of the interposer, or both.

More complex electrical interconnections may be provided by trace routing and/or other connective structures that transit through one or more internal layers of the interposer, for example as described for various embodiments below. For example, as those of skill understand, typically only one of the constituent IC devices of a stack is enabled at a time. However, some TSOPs have two or more chip enable leads that must be signaled for device enablement. Thus, when a stack is devised from such devices, the two CE signals that are available to the stack must be applied to two leads in each of the two constituent devices, i.e., to four leads total. This adds complexity to the interposer design and fabrication. The use of internal trace routing and/or other connective structures may be used to keep the outline profile of the stack approximately the same as the outline profile of the constituent IC devices, particularly when the leads to be connected are not adjacent on the ICs.

FIG. 3 and FIG. 4. collectively illustrate an embodiment of an interposer having multiple layers along which electrically conductive structures are deployed, which interposer deploys a combination of plated-through holes, blind vias, and buried vias to provide electrical connection between electrically conductive structures deployed at different layers. FIG. 3 depicts an idealized cross-section of a portion of such an interposer exhibiting its internal structure, while FIG. 4 depicts a plan view from above of selected layers of the interposer illustrated in FIG. 3. Electrically conductive structures used in such embodiments typically comprise metal, but other electrically conductive materials may be used. The interposer of the illustrated embodiment has four layers at which electrically conductive structures are deployed, which will be referred to herein as "conductive layers" L1-L4, but those of skill will recognize that interposers or carrier structures may have a single conductive layer or plural conductive layers numbering two or more.

The interposer of the embodiment illustrated in FIG. 3 and FIG. 4 has connective pads 30-36 disposed along upper conductive layer L1 and connective pads 40-46 disposed along lower conductive layer L4. Plated-through holes 70-74 electrically connect connective pads 30-34 disposed along L1 to connective pads 40-44 disposed along L4, respectively. Blind vias 60 and 61 electrically connect connective pads 35 and 36 disposed along L1 to capture pads 86 and 87, respectively, disposed along L2. In the illustrated embodiment, blind vias 60 and 61 are configured as micro vias, but those of skill will recognize that other configurations of blind vias may be used. Buried via 65 electrically connects capture pad 86 disposed along L2 with capture pad 96 disposed along L3.

At conductive layer L2, electrical interconnection between capture pads 85 and 87 is provided by trace 80, and at conductive layer L3, electrical interconnection between capture pads 95 and 96 is provided by trace 90. In addition, capture pad 85 provides an inner plane connection along L2 to plated-through hole 70, and capture pad 95 provides an inner plane connection along L3 to plated-through hole 71. In the illustrated embodiment, therefore, connective pads 30, 36, and 40 are electrically connected, and connective pads 31, 35, and 41 are electrically connected. Connective pads 45 and 46 are each electrically isolated in the illustrated embodiment.

Those of skill will recognize that connective pads 30-36 and/or 40-46 need not be located on a surface of the interposer, as long as the pads are accessible from the surfaces as, for example, through an aperture in a covercoat over the interposer. In addition, the deployment of connective and interconnection schemes in the illustrated embodiment is exemplary, and those of skill will understand that different connective and/or interconnection schemes may be necessary or desirable for particular configurations of ICs and/or module application environments.

Designers constrained to maintain within IC outline profile limits are often required to implement carrier structures or interposers that exhibit more complex designs, such as just described. If a profile constraint is intended to preserve mounting board area but does not limit cantilever designs that may exceed the outline profile above the surface of the mounting board, a wider interposer of simpler one- or two-layer design may, in some cases, be employed to preserve board mounting space but avoid the complexity of multi-layer interposers. The assignee of the present application, Staktek Group L.P., has disclosed such embodiments in an application filed contemporaneously herewith.

Designers constrained to maintain an outline profile limit, however, also may employ a multi-layer interposer designs using conductive transits, such as plated-through holes for example, that provide versatile, selective trace routing and other connective requirements such as those previously provided only by the use of a combination of blind vias and/or buried vias along with plated-through holes. Elimination of blind vias and buried vias avoids the costly precision mechanical or laser drilling required for such structures and, in many configurations, can loosen the tolerances required for registration of the various interposer layers.

FIG. 5 and FIG. 6. collectively illustrate an embodiment of an interposer having multiple layers along which electrically conductive structures are deployed, which interposer deploys conductive transits, devised in accordance with aspects of the present invention, to provide electrical connection between electrically conductive structures deployed at different layers. FIG. 5 depicts an idealized cross-section of a portion of an interposer of a preferred embodiment of the present invention exhibiting its internal structure, while FIG. 6 depicts a plan view from above of selected layers of the interposer illustrated in FIG. 5. The interposer of the illustrated embodiment has four layers at which electrically conductive structures are deployed, which will be referred to herein as "conductive layers" L1-L4, but those of skill will recognize that interposers or carrier structures may have a single conductive layer or plural conductive layers numbering two or more.

The interposer of the embodiment illustrated in FIG. 5 and FIG. 6 has connective elements devised as connective pads 30-36 disposed along upper conductive layer L1 and connective elements devised as connective pads 40-44 disposed along lower conductive layer L4. Connective pads 30-36 and 40-44 are configured for surface mounting of packaged IC leads. Conductive transits in the form of plated-through holes 70-74 electrically connect connective pads 30-34 disposed along L1 to connective pads 40-44 disposed along L4, respectively. Plated-through hole 75 electrically connects connective pad 35 to capture pad 96, and plated-through hole 76 electrically connect connective pad 36 to capture pad 87. At conductive layer L2, electrical interconnection between capture pads 85 and 87 is provided by trace 80, and at conductive layer L3, electrical interconnection between capture pads 95 and 96 is provided by trace 90. Plated-through holes 71-75 are offset to accommodate traces 80 and 90, and those of skill will recognize other conductive transit placements that may be used in particular applications to facilitate trace routing and other connective requirements. In addition, capture pads 85 and 87 provide inner plane connections along L2 to plated-through holes 70 and 76, respectively, and capture pads 95 and 96 provide inner plane connections along L3 to plated-through holes 71 and 75, respectively.

In the illustrated embodiment, capture pads 50 and 51 are deployed at L4 with plated-through holes 75 and 76, respectively, for structural stability of the plated-through holes. Alternatively, a full connective pad could be used, but the smaller capture pads are preferred.

In the illustrated embodiment, connective pads 30, 36, and 40 are electrically connected, and connective pads 31, 35, and 41 are electrically connected, achieving the interconnection scheme in the embodiment illustrated in FIG. 3 and FIG. 4 without the use of blind vias or buried vias. Unlike the embodiment illustrated in FIG. 3 and FIG. 4 in which connective pads 45 and 46 are electrically isolated, however, capture pads 50 and 51 are respectively connected to upper connective pads 35 and 36. Before interposer 2 is deployed in a final stack configuration, capture pads 50 and 51 are covered with an electrical insulator, such as solder mask, to prevent contact pads 50 and 51 from coming into contact with respect shoulders 15 of leads 13 of lower IC 10.

Those of skill will recognize that connective pads 30-36 and/or 40-44 need not be located on a surface of the interposer, as long as the pads are accessible from the surfaces as, for example, through an aperture in a covercoat over the interposer. In addition, the deployment of connective and interconnection schemes in the illustrated embodiment is exemplary, and those of skill will understand that different connective and/or interconnection schemes may be necessary or desirable for particular configurations of ICs and/or module application environments.

FIG. 7 depicts a partial cross-section of an exemplar interposer or carrier structure in accordance with a preferred embodiment of the present invention. The illustrated cross-section is taken along line 7-7 of FIG. 5. As shown in FIG. 7, module 1 of the illustrated embodiment deploys ICs 10 and 20 in a stacked configuration, with IC 20 stacked above IC 10. Lead 23 emerges from peripheral wall 22 of IC 20, and lead 13 emerges from peripheral wall 12 of IC 10. As discussed above, upper connective pad 31 is disposed along upper surface 7 of interposer 2, and lower connective pad 41 is disposed along lower surface 6 of interposer 2. In the illustrated embodiment, upper surface 7 and lower surface 6 are substantially planar. As those of skill will understand, the connective pads disposed along the interposer surfaces need not be on the outer surfaces, but only accessible from the surfaces, for example by apertures, and surfaces 6 and 7 need not be substantially planar. Conductive transit 71, in the form of a plated-through hole, electrically connects connective pads 31 and 41 and capture pad 95 disposed along L3 of interposer 2. Lead foot 27 of lead 23 of upper IC 20 is connected to connective pad 31 in the illustrated embodiment using solder 59. Lead shoulder 15 of lead 13 of lower IC 10 is similarly connected to connective pad 41.

FIG. 8 depicts another partial cross-section of an exemplar interposer or carrier structure in accordance with a preferred embodiment of the present invention. The illustrated cross-section is taken along line 8-8 of FIG. 5. As discussed above, upper connective pad 36 is disposed along upper surface 7 of interposer 2, and lower capture pad 51 is disposed along lower surface 6 of interposer 2. Conductive transit 76, in the form of a plated-through hole, electrically connects connective pads 36 and capture pad 87 disposed along L2 of interposer 2. Lead foot 27 of lead 23 of upper IC 20 is connected to connective pad 31 in the illustrated embodiment using solder 59. As discussed above, capture pad 51 disposed at L4 of interposer 2 also is electrically connected to connective pad 36 and capture pad 2. Therefore, insulator 58, which comprises solder mask in the illustrated embodiment, maintains electrical isolation between capture pad 51 and lead should 15 of lead 13 of lower IC 10.

Although the present invention has been described in detail, it will be apparent that those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A circuit module, comprising:
   a first packaged integrated circuit having a first plurality of leads emergent therefrom;
   a second packaged integrated circuit having a second plurality of leads emergent therefrom; and
   an interposer disposed between and in contact with the first plurality of leads and the second plurality of leads, the interposer comprising:
   a first set of connective elements disposed along a first surface of the interposer and in contact with selected leads of the first plurality of leads;
   a second set of connective elements disposed along a second surface of the interposer and in contact with selected leads of the second plurality of leads;
   a first conductive path that provides electrical communication between a connective element of the first set of connective elements and a connective element of the second set of connective elements;
   a second conductive path that provides electrical communication between connective elements of the first set of connective elements and a connective element of the second set of connective elements, wherein the second conductive path comprises a trace that interconnects capture pads and that is orthogonal to the first conductive path.

2. An interposer for providing electrical communication between leads in a module of stacked leaded packaged integrated circuits, the interposer comprising:
   a multi-layer printed circuit board defining first and second surfaces;
   a first set of connective elements disposed along the first surface;
   a second set of connective elements disposed along the second surface;
   a first conductive path that provides electrical communication between a connective element of the first set of connective elements and a connective element of the second set of connective elements, the first conductive path orthogonal to the first and second surfaces;
   a second conductive path that provides electrical communication between connective elements of the first set of connective elements and a connective element of the second set of connective elements, a portion of the second conductive path parallel to the first and second surfaces wherein the second conductive path comprises a trace that interconnects capture pads and that is orthogonal to the first conductive path, wherein the trace and the capture pads are disposed between layers of the multi-layer printed circuit board.

3. An interposer for providing electrical communication between leads in a module of stacked leaded packaged integrated circuits, the interposer comprising:
   a multi-layer printed circuit board defining first and second surfaces;
   a first set of connective elements disposed along the first surface;
   a second set of connective elements disposed along the second surface;
   a first conductive path that provides electrical communication between a connective element of the first set of connective elements and a connective element of the second set of connective elements, the first conductive path orthogonal to the first and second surfaces;
   a second conductive path that provides electrical communication between connective elements of the first set of connective elements and a connective element of the second set of connective elements, a portion of the second conductive path parallel to the first and second surfaces wherein the second conductive path further comprises a blind via that provides electrical communication between one of the connective elements of the first set of connective elements and a capture pad.

4. The interposer of claim 2, further comprising a third conductive path that provides electrical communication between connective elements of the first set of connective elements and a connective element of the second set of connective elements different than the connective elements in electrical communication through the second conductive path.

5. An interposer for providing electrical communication between leads in a module of stacked leaded packaged integrated circuits, the interposer comprising:
- a multi-layer printed circuit board defining first and second surfaces;
- a first set of connective elements disposed along the first surface;
- a second set of connective elements disposed along the second surface;
- a first conductive path that provides electrical communication between a connective element of the first set of connective elements and a connective element of the second set of connective elements, the first conductive path orthogonal to the first and second surfaces;
- a second conductive path that provides electrical communication between connective elements of the first set of connective elements and a connective element of the second set of connective elements, a portion of the second conductive path parallel to the first and second surfaces wherein a connective element disposed on one of the first and second surfaces is electrically isolated from other connective elements.

* * * * *